(12) United States Patent
Woo

(10) Patent No.: US 11,255,899 B2
(45) Date of Patent: Feb. 22, 2022

(54) TEST MODULE INCLUDING TEMPERATURE CONTROLLER, TEST HANDLER INCLUDING TEMPERATURE CONTROLLER, AND METHOD OF TESTING SEMICONDUCTOR DEVICE USING TEST CHAMBER INCLUDING TEMPERATURE CONTROLLER

(71) Applicant: SAMSUNG ELECTRONICS CO., LTD., Suwon-si (KR)

(72) Inventor: Kiryong Woo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

(21) Appl. No.: 16/853,191

(22) Filed: Apr. 20, 2020

(65) Prior Publication Data
US 2021/0063473 A1 Mar. 4, 2021

(30) Foreign Application Priority Data
Aug. 27, 2019 (KR) .......................... 10-2019-0104923

(51) Int. Cl.
*G01R 31/28* (2006.01)
(52) U.S. Cl.
CPC ..... *G01R 31/2817* (2013.01); *G01R 31/2808* (2013.01)
(58) Field of Classification Search
CPC ............ G01R 31/2877; G01R 31/2862; G01R 1/0458; G01R 31/01; G01R 31/2806;
(Continued)

(56) References Cited

U.S. PATENT DOCUMENTS

| 6,078,188 A * | 6/2000 | Bannai ............... G01R 31/2851 324/750.03 |
| 6,552,561 B2 | 4/2003 | Olsen et al. |
| 6,728,652 B1 * | 4/2004 | Kobayashi ......... G01R 31/2851 702/117 |

(Continued)

FOREIGN PATENT DOCUMENTS

| JP | 002773709 | 4/1998 |
| JP | 2010073666 | 4/2010 |

(Continued)

OTHER PUBLICATIONS

US 9,347,967 B2, 05/2016, Schroeder et al. (withdrawn)

*Primary Examiner* — Vinh P Nguyen
(74) *Attorney, Agent, or Firm* — F. Chau & Associates, LLC

(57) ABSTRACT

A test module, is provided including a tester that electrically tests a semiconductor device. A device under test (DUT) board is connected to the tester and the semiconductor device. A base board is disposed between the DUT board and the tester. The base board includes a lower plate, a plurality of connection lines that penetrate the lower plate, an upper plate disposed on the lower plate, and a first temperature controller disposed in the base board. The first temperature controller maintains the connection lines at a first temperature. A docking connector is disposed on the first temperature controller. The docking connector connects the connection lines to the DUT board. A second temperature controller is disposed between the first temperature controller and the upper plate. The second temperature controller maintains the docking connector at a second temperature different from the first temperature.

20 Claims, 13 Drawing Sheets

(58) Field of Classification Search
CPC .......... G01R 31/2863; G01R 31/2868; G01R 31/2875; G01R 1/0491; G01R 31/2808; G01R 31/2817; G01R 31/2889; G01R 31/2891; G01R 31/311; G01R 31/2867; G01R 31/2865; G01R 31/2879; G01R 31/2893; F01D 25/32; F01D 17/16; F01D 17/165; F01D 17/167; F01D 5/147; F01D 5/148; F24H 1/121; F24H 4/04; F24H 9/001; F24H 9/02; F24H 9/2007; F24H 9/2064; F24H 1/009; F24H 1/06; F24H 1/523; F24H 6/00; F24H 9/2028; F24H 9/2035; F24H 9/2085; F28D 7/0008; F28D 1/0478; F28D 20/023; F28D 5/02; F28F 3/02; G06F 1/20; G06F 1/206; B65G 49/00; B65G 49/07; F25B 2339/047; F25B 2600/112; F25B 2700/2117; F25B 30/02; F25B 49/02; H01L 21/67242; H01L 22/14; H01L 22/34

See application file for complete search history.

(56) References Cited

U.S. PATENT DOCUMENTS

| | | | | |
|---|---|---|---|---|
| 7,554,349 | B2 * | 6/2009 | Kang | G01R 31/2865 |
| | | | | 324/750.03 |
| 7,919,974 | B2 * | 4/2011 | Yamashita | G01R 31/2865 |
| | | | | 324/757.01 |
| 9,889,611 | B2 | 1/2018 | Ryan et al. | |
| 10,060,968 | B2 | 8/2018 | Jung et al. | |
| 2018/0031668 | A1 | 2/2018 | Jang | |
| 2018/0038905 | A1 | 2/2018 | Yang et al. | |

FOREIGN PATENT DOCUMENTS

| | | |
|---|---|---|
| JP | 4546335 | 9/2010 |
| KR | 10-2008-0096088 | 10/2008 |
| KR | 10-2015-0019102 | 2/2015 |
| KR | 10-0790988 | 1/2018 |
| KR | 10-1924859 | 2/2019 |
| KR | 10-2019-0045223 | 5/2019 |
| KR | 10-2019-0054483 | 5/2019 |

\* cited by examiner

FIG. 11

| +1 | +1 | +2 | +2 | +2 | +2 | +1 | +1 |
|----|----|----|----|----|----|----|----|
| +1 | +2 | +3 | +3 | +3 | +3 | +2 | +1 |
| +2 | +3 | +3 | +4 | +4 | +3 | +3 | +2 |
| +2 | +3 | +4 | +5 | +5 | +4 | +3 | +2 |
| +2 | +3 | +4 | +5 | +5 | +4 | +3 | +2 |
| +2 | +3 | +3 | +4 | +4 | +3 | +3 | +2 |
| +1 | +2 | +3 | +3 | +3 | +3 | +2 | +1 |
| +1 | +1 | +2 | +2 | +2 | +2 | +1 | +1 |

206

10

TEST MODULE INCLUDING TEMPERATURE CONTROLLER, TEST HANDLER INCLUDING TEMPERATURE CONTROLLER, AND METHOD OF TESTING SEMICONDUCTOR DEVICE USING TEST CHAMBER INCLUDING TEMPERATURE CONTROLLER

CROSS-REFERENCE TO RELATED APPLICATION

This U.S. nonprovisional application claims priority under 35 U.S.C. § 119 to Korean Patent Application No. 10-2019-0104923, filed on Aug. 27, 2019 in the Korean Intellectual Property Office (KIPO), the disclosure of which is incorporated by reference herein in its entirety.

TECHNICAL FIELD

The present inventive concepts relate to a test module, a test handler, and a method of testing a semiconductor device by using the test handler.

DISCUSSION OF THE RELATED ART

Recently, semiconductor devices have rapidly increased in capacity. Thus, the time required for electrically testing semiconductor devices has also steadily increased. Many studies on test facilities have been actively conducted in order to increase the efficiency of a semiconductor device electrical testing process. A test handler among test facilities may test a plurality of semiconductor devices under severe environmental conditions such as very high and very low temperatures. Air in the test handler may heat or cool the semiconductor devices.

For example, after completing a fabrication process, semiconductor chips undergo a reliability test process. The reliability test process may be mainly performed at high temperatures (greater than room temperature) and at low temperatures (less than room temperature). For example, the semiconductor chips are tested at a low temperature between about −25° C. and −5° C. and at a high temperature between 50° C. and 120° C. A test handler may provide a test environment for the semiconductor chips. The test handler may include a test chamber and a test apparatus connected to the test chamber. The test chamber may heat or cool the semiconductor chips to the high temperature or the low temperature. The test apparatus may be connected to the semiconductor chips in the test chamber and may then test the semiconductor chips. A typical test apparatus may be maintained at room temperature and may be connected to semiconductor chips that have been heated or cooled. The semiconductor chips may have temperature differences caused by connection lines or connectors of the test apparatus. However, temperature differences in the semiconductor chips may reduce the reliability of the test process.

SUMMARY

According to an exemplary embodiment of the present inventive concept, a test module is provided including a tester that electrically tests a semiconductor device. A device under test (DUT) board is connected to the tester and the semiconductor device. A base board is disposed between the DUT board and the tester. The base board includes a lower plate, a plurality of connection lines that penetrate the lower plate, an upper plate disposed on the lower plate, and a first temperature controller disposed in the base board. The first temperature controller maintains the connection lines at a first temperature. A docking connector is disposed on the first temperature controller. The docking connector connects the connection lines to the DUT board. A second temperature controller is disposed between the first temperature controller and the upper plate. The second temperature controller maintains the docking connector at a second temperature different from the first temperature.

According to an exemplary embodiment of the present inventive concept, a test handler is provided including a tray on which a semiconductor device is mounted. A test apparatus is adjacent to the tray. The test apparatus includes a test module electrically connected to the semiconductor device. The test module includes a tester that electrically tests the semiconductor device, a device under test (DUT) board connected to the semiconductor device, and a base board connected to the DUT board and the tester. The base board includes a lower plate, a plurality of connection lines that penetrate the lower plate, an upper plate disposed on the lower plate, and a docking connector that penetrates the upper plate and connects the plurality of connection lines to the DUT board. A first temperature controller is disposed between the lower plate and the docking connector. The first temperature controller maintains the connection lines at a first temperature. A second temperature controller which maintains the docking connector at a second temperature different from the first temperature.

According to an exemplary embodiment of the present inventive concept, a method of testing a semiconductor device is provided including providing a test chamber with a test tray on which the semiconductor device is mounted. The test chamber is provided with a first hot air or a first cool air to heat or cool the semiconductor device to a first temperature. The first hot air and the first cool air are different from room temperature air. A first temperature controller is provided with the room temperature air to maintain a plurality of connection lines at a second temperature different from the first temperature. The first temperature controller is disposed below a device under test (DUT) board, and the connection lines are connected to the DUT board. A second temperature controller disposed between the DUT board and the first temperature controller is provided with a second hot air or a second cool air to heat or cool a docking connector to the first temperature. The second hot air and the second cool air are different from room temperature air, and the docking connector connects the connection lines to the DUT board. The semiconductor device is tested by using a tester connected to the connection lines.

BRIEF DESCRIPTION OF THE DRAWINGS

FIG. 11 is a diagram illustrating differences in temperatures of semiconductor devices that are tested in a typical test module, according to an exemplary embodiment of the present inventive concept;

DETAILED DESCRIPTION OF THE EMBODIMENTS

Figure 1:
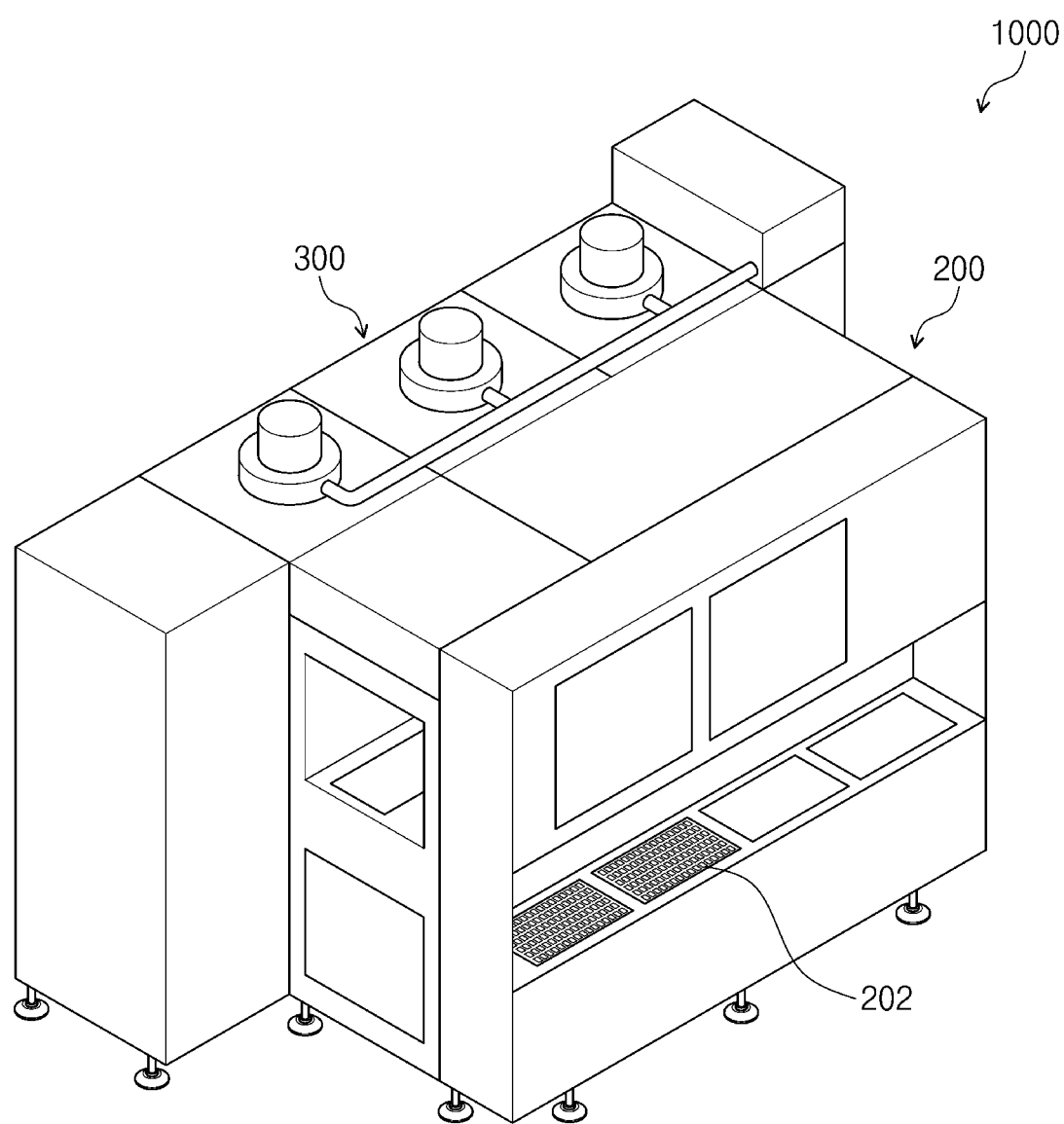
FIG. 1 is a perspective view illustrating a test handler, according to an exemplary embodiment of the present inventive concept.

FIG. 1 illustrates a test handler 1000, according to an exemplary embodiment of the present inventive concept.

Referring to FIG. 1, the test handler 1000 may include a sorting apparatus 200 and a test apparatus 300. The test apparatus 300 may be disposed on a sidewall of the sort apparatus 200. The sorting apparatus 200 may transfer trays 202 to the test apparatus 300. The test apparatus 300 may electrically test semiconductor devices (see 10 of FIG. 2) in the trays 202. In addition, the sorting apparatus 200 may sort the semiconductor devices 10 tested in the test apparatus 300 into approved semiconductor devices and failed semiconductor devices.

Figure 2:
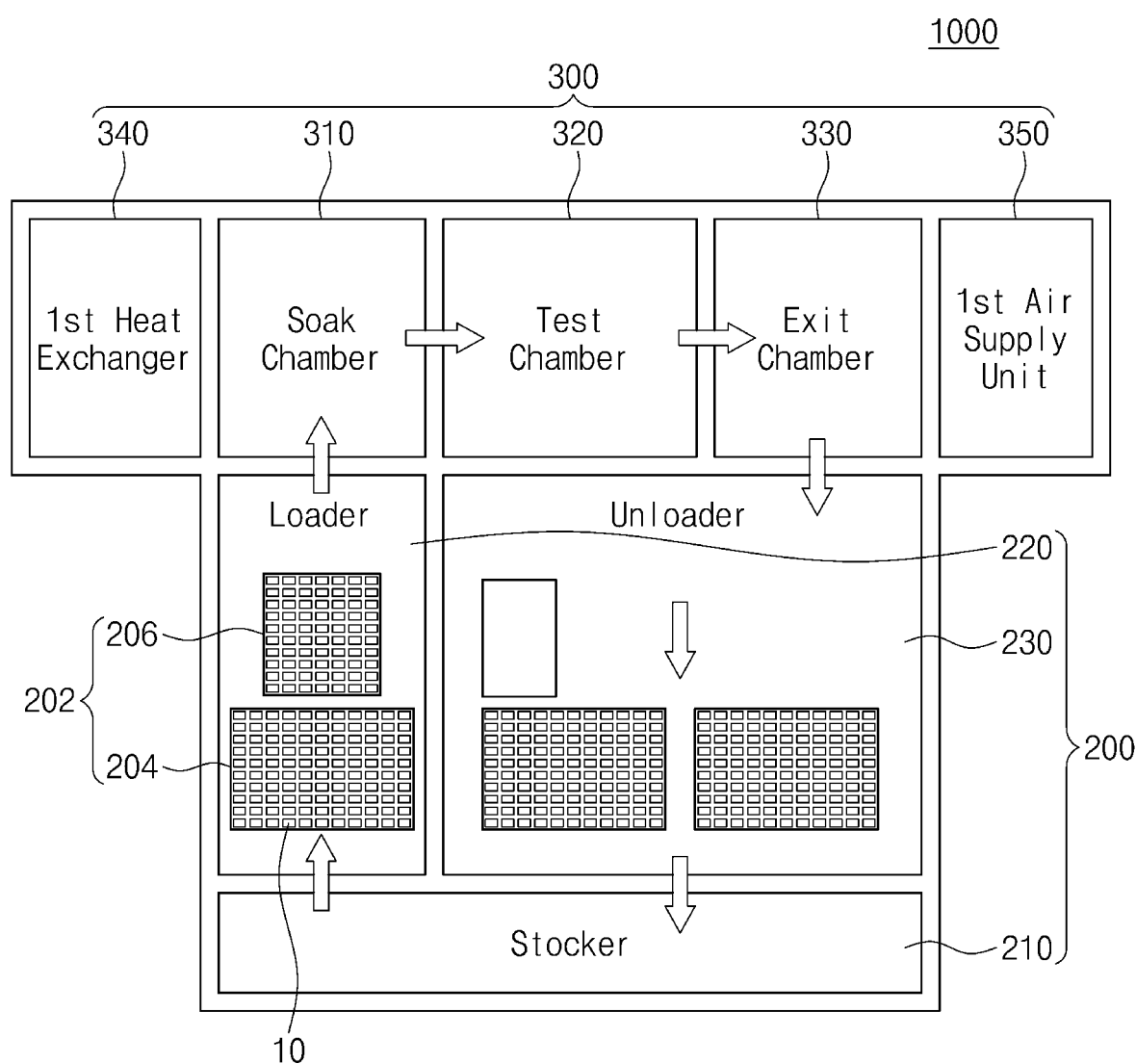
FIG. 2 is a plan view illustrating the sorting apparatus and the test apparatus depicted in FIG. 1, according to an exemplary embodiment of the present inventive concept.

FIG. 2 is a plan view illustrating the sorting apparatus 200 and the test apparatus 300 depicted in FIG. 1, according to an exemplary embodiment of the present inventive concept.

Referring to FIG. 2, the sorting apparatus 200 may include a stocker 210, a loader 220, and an unloader 230.

The stocker 210 may store the tray 202 and the semiconductor devices 10 in the tray 202.

The loader 220 may be disposed between the stocker 210 and the test apparatus 300. The loader 220 may receive the trays 202. For example, the tray 202 may include a carrier tray 204 and a test tray 206. The carrier tray 204 may be larger than the test tray 206. For example, the carrier tray 204 may have a bigger planar area relative to the test tray 206. The carrier tray 204 may be used for storing or transporting the semiconductor devices 10. The test tray 206 may be used for testing the semiconductor devices 10. The test tray 206 may be disposed nearer to the test apparatus 300 relative to the carrier tray 204 in the loader 220. A carrier tray 204 may also be provided in the unloader 230.

Figure 3:
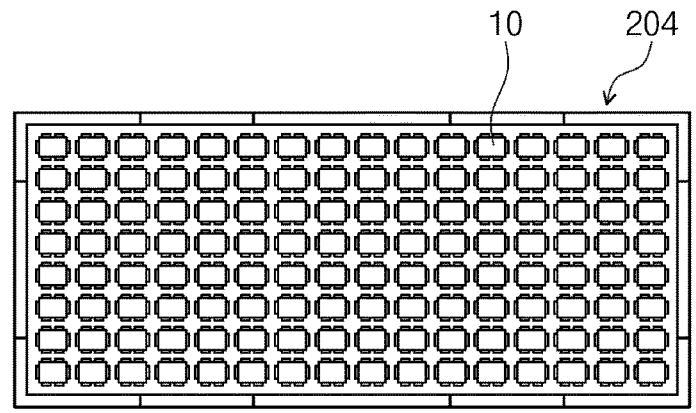
FIG. 3 is a plan view illustrating the carrier tray depicted in FIG. 2, according to an exemplary embodiment of the present inventive concept.

FIG. 3 is a plan view illustrating the carrier tray 204 depicted in FIG. 2, according to an exemplary embodiment of the present inventive concept.

Referring to FIG. 3, the carrier tray 204 may mount the semiconductor devices 10. For example, the carrier tray 204 may mount about 200 to about 1,500 semiconductor devices 10. The carrier tray 204 may be provided into the loader 220 and the stocker 210. An overhead hoist transport (OHT) may convey the carrier tray 204 into a semiconductor fabrication line.

Figure 4:
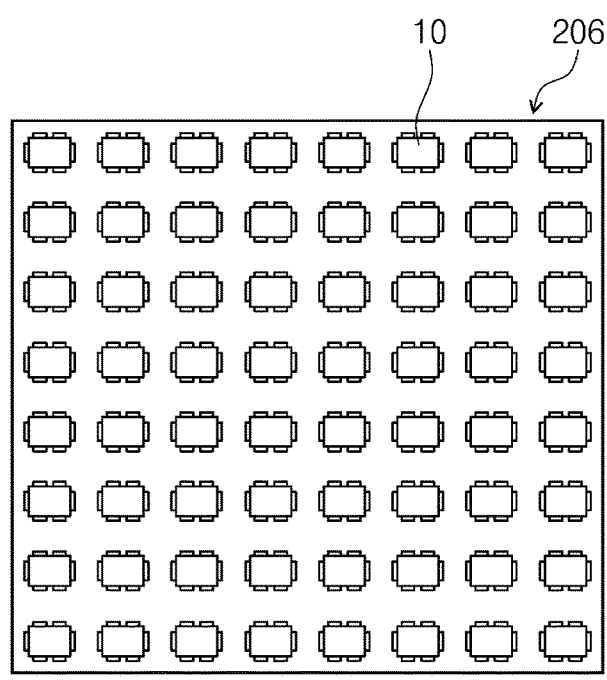
FIG. 4 is a plan view illustrating an example of the test tray depicted in FIG. 2, according to an exemplary embodiment of the present inventive concept.

FIG. 4 is a plan view illustrating the test tray 206 depicted in FIG. 2, according to an exemplary embodiment of the present inventive concept.

Referring to FIG. 4, the test tray 206 may mount the semiconductor devices 10 and may provide the test apparatus 300 with the semiconductor devices 10. For example, the test tray 206 may mount about 64 (e.g., an 8×8 array) semiconductor devices 10, but the present inventive concept is not limited thereto.

Referring back to FIG. 2, the loader 220 may receive the carrier tray 204 from the stocker 210. The loader 220 may transfer the semiconductor devices 10 from the carrier tray 204 to the test tray 206. The loader 220 may provide the test tray 206 into the test apparatus 300.

The unloader 230 may be disposed between the test apparatus 300 and the stocker 210. The unloader 230 may be adjacent to the loader 220. When the test apparatus 300 completes a test process on the semiconductor devices 10, the unloader 230 may receive the test tray 206 from the test apparatus 300. The unloader 230 may transfer the semiconductor devices 10 from the test tray 206 to the carrier tray 204. The semiconductor devices 10 may be sorted based on test results and then may be mounted into the carrier tray 204. Afterwards, the carrier tray 204 may be provided to the stocker 210. The overall testing path may be a closed-line rectilinear shape beginning and ending at the stocker 210, but the present inventive concept is not limited thereto.

Referring again to FIG. 2, the test apparatus 300 may include a soak chamber 310, a test chamber 320, an exit chamber 330, a first heat exchanger 340, and a first air supply unit 350.

The soak chamber 310 may be disposed adjacent to the loader 220. The soak chamber 310 may have a first robot arm that transfers the test tray 206 between the loader 220 and the test chamber 320. For example, before performing a test, the soak chamber 310 may pre-heat or pre-cool the test tray 206 and the semiconductor devices 10.

The test chamber 320 may be disposed between the soak chamber 310 and the exit chamber 330. The test chamber 320 may use a first hot air (see 351 of FIG. 5) or a first cool air (see 353 of FIG. 5) of the first air supply unit 350 to heat or cool the test tray 206 and the semiconductor devices 10. The semiconductor devices 10 may be electrically tested in the test chamber 320.

The exit chamber 330 may be disposed adjacent to the unloader 230. The exit chamber 330 may have a second robot arm that transfers the test tray 206 between the test chamber 320 and the unloader 230. The exit chamber 330 may unload tested semiconductor devices 10 and the test tray 206 from the test chamber 320, and then may provide the unloader 230 with the tested semiconductor devices 10 and the test tray 206.

According to an exemplary embodiment of the present inventive concept, one robot arm may be provided to perform all of the aforementioned transfer operations.

Figure 5:
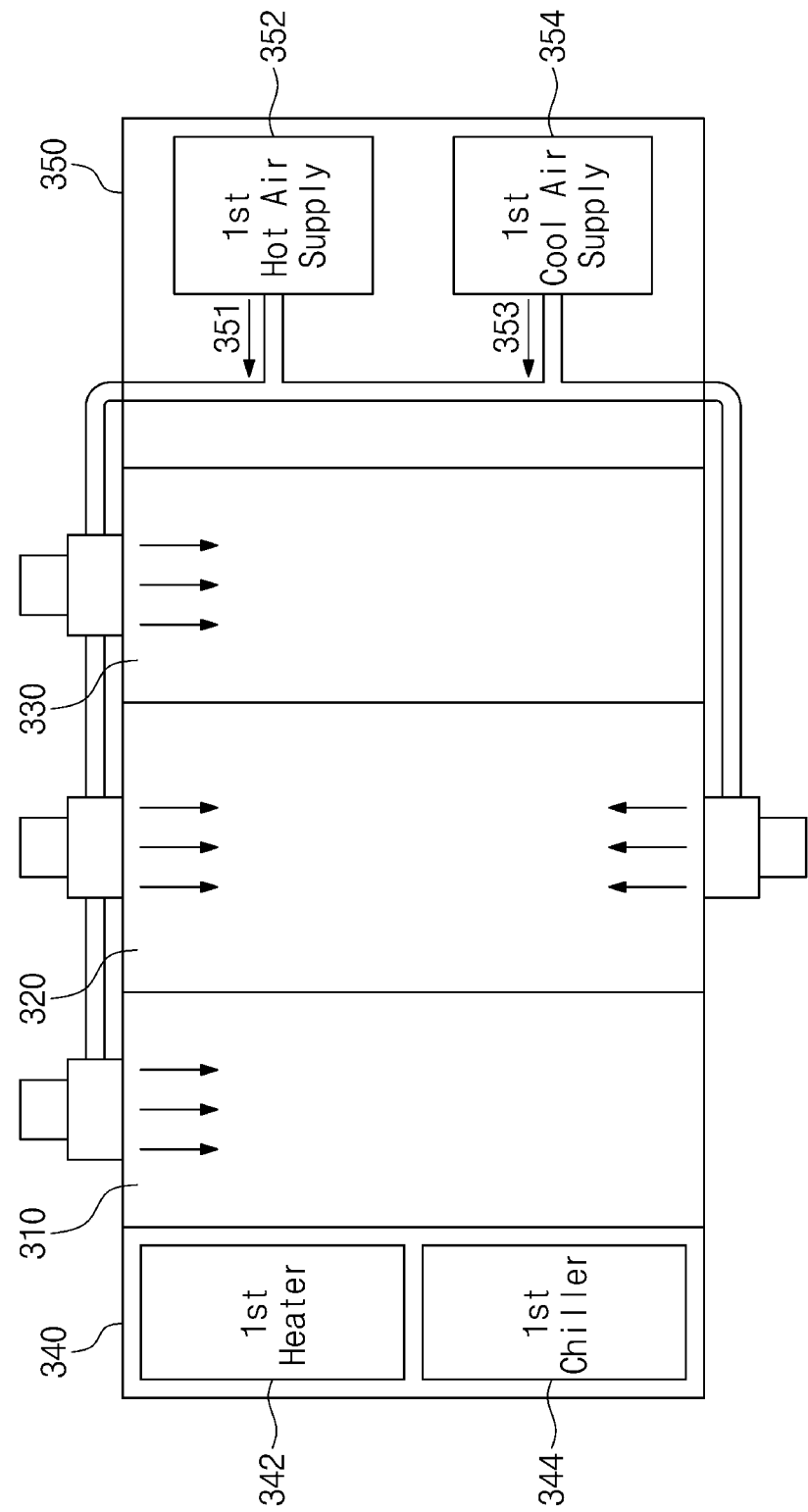
FIG. 5 is a schematic diagram illustrating the heat exchanger and the air supply unit depicted in FIG. 2, according to an exemplary embodiment of the present inventive concept.

FIG. 5 illustrates the first heat exchanger 340 and the first air supply unit 350 depicted in FIG. 2, according to an exemplary embodiment of the present inventive concept.

Referring to FIG. 5, the first heat exchanger 340 may be disposed adjacent to the soak chamber 310. The first heat exchanger 340 may provide a first heat medium or a first coolant to the soak chamber 310, the test chamber 320, and a first fluid path (see 380 of FIG. 6) within a wall of the test apparatus 300. For example, coils may comprise the first fluid path 380 and may be interconnected. The coils comprising the first fluid path 380 may be disposed between an innermost wall of the test apparatus 300 and an outermost wall of the test apparatus 300. The first fluid path 380 may span from the soak chamber 310 to the exit chamber 330.

The first heat exchanger 340 may include a first heater 342 and a first chiller 344. The first heater 342 may circularly supply the first fluid path 380 with the first heat medium. The first chiller 344 may circularly supply the first fluid path 380 with the first coolant. For example, the first fluid path 380 may be connected at both ends to the first heat exchanger 340, and the fluid circulating within the first fluid path 380 may be returned to the first heat exchanger 340, or the first fluid path 380 may substantially form a loop.

The first air supply unit 350 may be disposed adjacent to the exit chamber 330. The first air supply unit 350 may provide the soak chamber 310, the test chamber 320, and the exit chamber 330 with a first hot air 351 or a first cool air 353 to heat or cool the semiconductor devices 10. The first hot air 351 and the first cool air 353 may be a substantially different temperature from atmospheric air (e.g., room temperature air). Supply lines connected to the first hot air supply 352 and the first cool air supply 354 may integrate into a common distribution network of lines that extend around substantially the entire test apparatus 300. For example, the distribution network of lines may have a lower line that extends to the underside of the test chamber 320, and connects to a port thereof and an upper line that connects to an upper side of at least one of the soak chamber 310, the test chamber 320, and the exit chamber 350, and respective ports thereof. The first hot air 351 may have a temperature greater than an atmospheric air temperature (e.g., 20° C. to 25° C.). For example, the first hot air 351 may have a temperature of about 80° C. or more. The first cool air 353 may have a temperature less than an atmospheric air temperature (e.g., 20° C. to 25° C.). For example, the first cool air 353 may have a temperature of about −25° C. or less. The first air supply unit 350 may include, for example, a first hot air supply 352 and a first cool air supply 354. The first hot air supply 352 may provide the soak chamber 310, the test chamber 320, and the exit chamber 330 with the first hot air 351 to heat the semiconductor devices 10 to a higher temperature than room temperature. The temperatures within the soak chamber 310, the test chamber 320, and the exit chamber 330 may be the same as or different from one another. The semiconductor devices 10 may be heated at the high temperature of about 80° C. by the first hot air 351, but the present inventive concept is not limited thereto. For example, the first cool air supply 354 may provide the soak chamber 310, the test chamber 320, and the exit chamber 330 with the first cool air 353 to cool the semiconductor devices 10 to the temperature lower than room temperature. For example, the semiconductor devices 10 may be cooled by the first cool air 353 at the low temperature of about −25° C.

Figure 6:
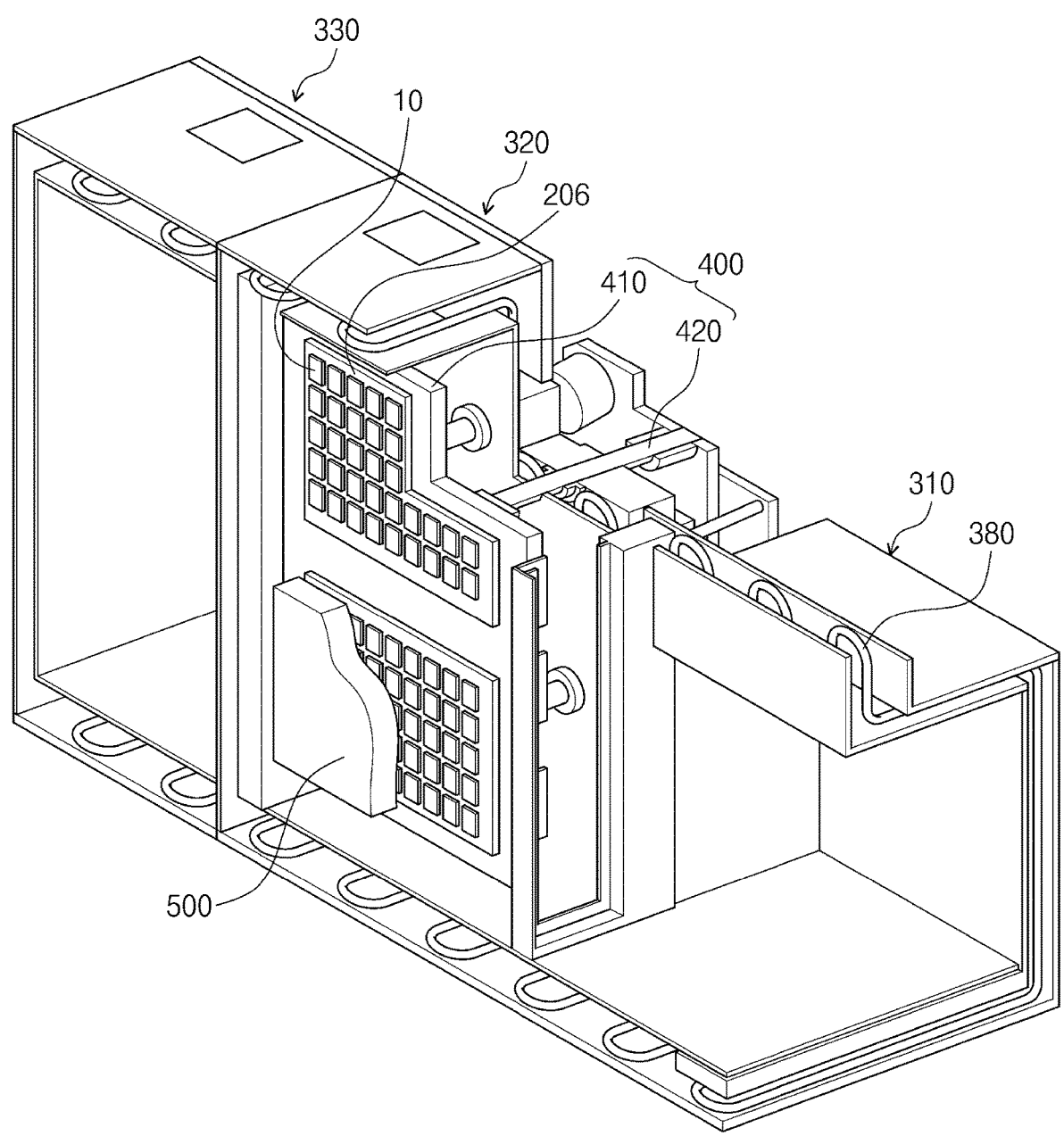
FIG. 6 is a perspective view illustrating the test apparatus depicted in FIG. 1, according to an exemplary embodiment of the present inventive concept.
Figure 7:
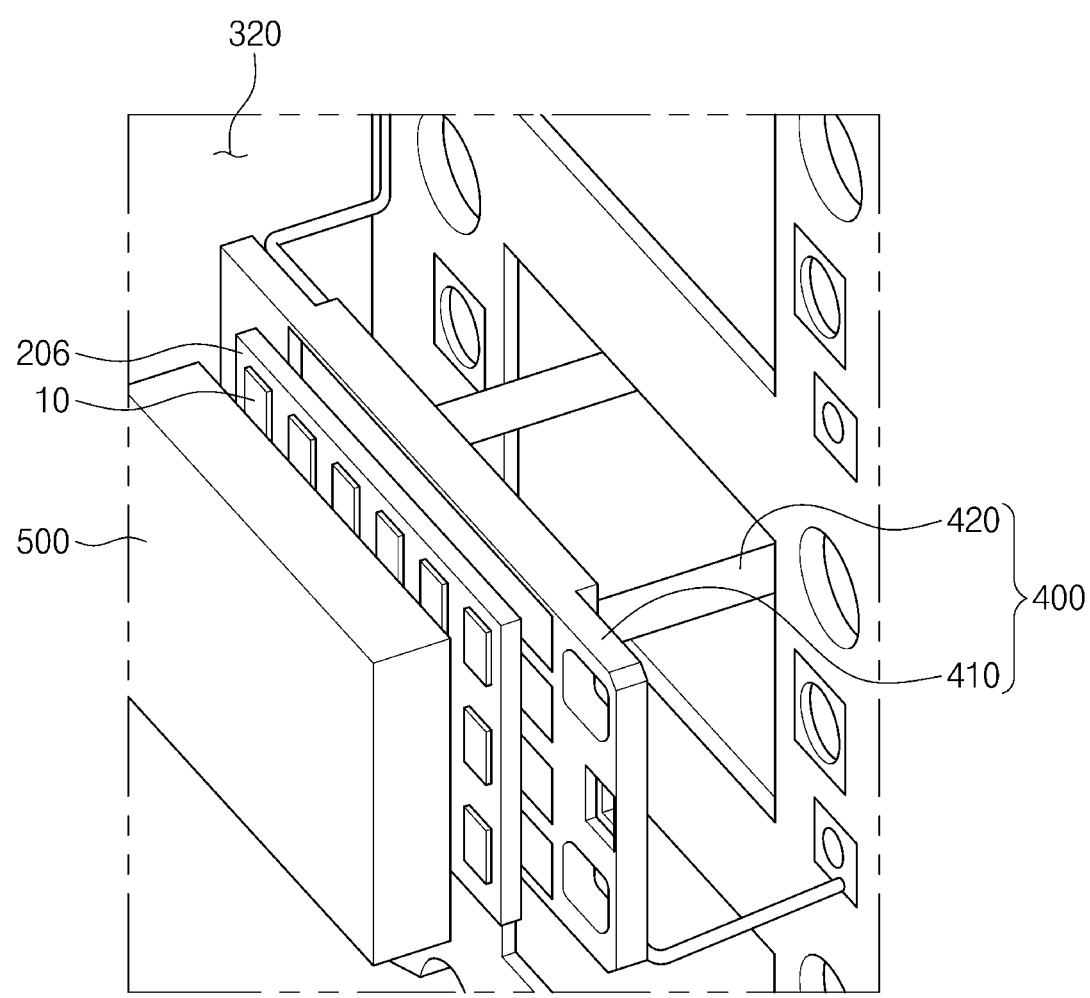
FIG. 7 is a partial perspective view illustrating the pusher and test modules depicted in FIG. 6, according to an exemplary embodiment of the present inventive concept.

FIG. 6 illustrates an example of the test apparatus 300 depicted in FIG. 1, according to an exemplary embodiment of the present inventive concept. FIG. 7 illustrates the pusher module 400 and the test module 500 depicted in FIG. 6, according to an exemplary embodiment of the present inventive concept.

Referring to FIGS. 6 and 7, the test apparatus 300 may further include the pusher module 400 and the test module 500 that are disposed on opposite sides of the test tray 206 in the test chamber 320. The soak chamber 310 and the exit chamber 330 of the test apparatus 300 may be configured similarly to those in FIG. 2.

The pusher module 400 may be disposed on a first side of the test tray 206 and the semiconductor devices 10. The pusher module 400 may push the test tray 206 and the semiconductor devices 10 against the test module 500. The pusher module 400 may include, for example, a contact drive plate 410 and a rod pusher 420. The contact drive plate 410 may push the test tray 206 against the test module 500. The rod pusher 420 may push the semiconductor devices 10 in the test tray 206 against the test module 500.

The test module 500 may be disposed on a second side of the test tray 206 and the semiconductor devices 10 opposite to the first side. The test module 500 may be engaged with a port of the test chamber 320. The test module 500 may be connected from outside to inside of the test chamber 320. The test module 500 may electrically test the semiconductor devices 10 at high temperature (e.g., 85° C.) or low temperature (e.g., −25° C.) different from room temperature.

Figure 8:
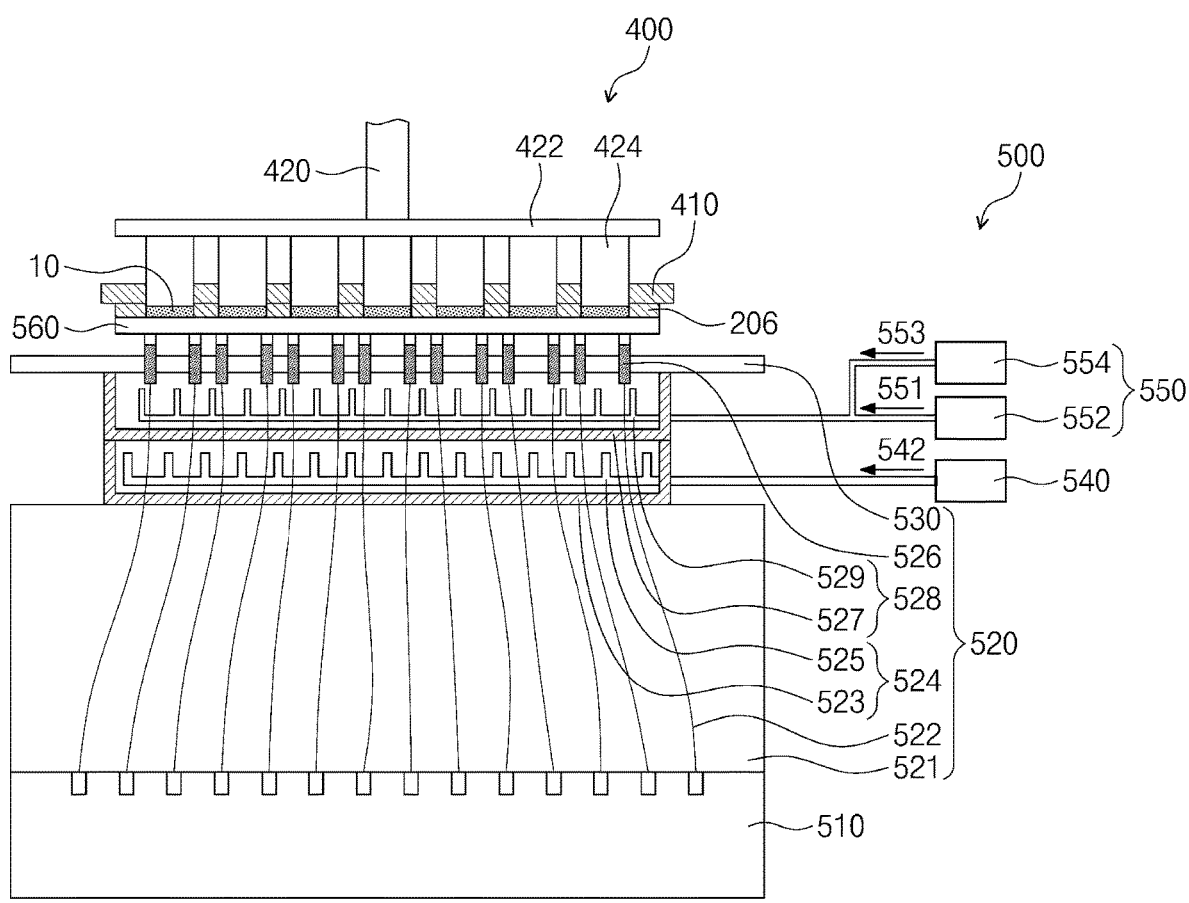
FIG. 8 is a cross-sectional view illustrating an example of the test module depicted in FIG. 6, according to an exemplary embodiment of the present inventive concept.

FIG. 8 illustrates the test module 500 depicted in FIG. 6, according to an exemplary embodiment of the present inventive concept.

Referring to FIG. 8, the test module 500 may include a tester 510, a base board 520, a second air supply unit 540, a third air supply unit 550, and a device under test (DUT) board 560.

The tester 510 may perform a test process on the semiconductor devices 10. For example, the tester 510 may execute an electrical die sorting (EDS) test process. The tester 510 may be disposed outside the test chamber 320. For example, when the tester 510 is disposed inside the test chamber 320, electrical test values of the semiconductor devices 10 may experience noises caused by test temperature, and thus the test process may decrease in reliability. Therefore, the tester 510 may be disposed outside the test chamber 320 and thus may be kept at room temperature.

The base board 520 may be disposed on the tester 510. The base board 520 may be connected to the tester 510. For example, the base board 520 may connect the DUT board 560 to the tester 510. The base board 520 may be disposed outside the test chamber 320. For example, the base board 520 may include a lower plate 521, connection lines 522, a first temperature controller 524, a docking connector 526, a second temperature controller 528, and an upper plate 530.

The lower plate 521 may be disposed adjacent to the tester 510. The lower plate 521 may include a polymeric compound and/or a resin.

The connection lines 522 may penetrate the lower plate 521 and may connect the tester 510 to the docking connector 526. For example, the connection lines 522 may connect to a docking connector 526 at a first end and may connect to an upper surface of the tester 510 at a second end. The docking connector 526 may be disposed on the DUT board 560 and may penetrate through the upper plate 530 and a space formed within the upper box structure 527. For example, each of the connection lines 522 may include a copper line.

The first temperature controller 524 may be disposed on the lower plate 521. The first temperature controller 524 may use a room temperature air 542 of the second air supply unit 540 to maintain the connection lines 522 on the lower plate 521 at room temperature. The room temperature air 542 may be atmospheric air whose temperature is in a range of about 20° C. to about 25° C. The first temperature controller 524 may include, for example, a lower box structure 523 and a lower nozzle 525. The lower box structure 523 may be disposed on the lower plate 521. The connection lines 522 may be provided in the lower box structure 523. The lower nozzle 525 may be disposed in the lower box structure 523. The lower nozzle 525 may be connected to the second air supply unit 540. The lower nozzle 525 may provide the connection lines 522 with the room temperature air 542 to maintain the connection lines 522 at room temperature.

The docking connectors 526 may be disposed on the lower box structure 523 of the first temperature controller 524. The docking connectors 526 may connect the connection lines 522 to the DUT board 560.

The second temperature controller 528 may be disposed between the lower box structure 523 and the upper plate 530.

According to an exemplary embodiment of the present inventive concept, the spaces within the lower box structure 523 and the upper box structure 527 might not be communicated with one another (i.e., sealed off from one another).

According to an exemplary embodiment of the present inventive concept, the upper box structure 527 may be further divided into contiguous, but non-communicated spaces with independently provided air supplies.

The second temperature controller 528 may at least partially surround lower portions of the docking connectors 526. The second temperature controller 528 may heat or cool the docking connectors 526 and the DUT board 560 to temperatures substantially different from room temperature. When the semiconductor devices 10 in the test chamber 320 are heated to high temperature (e.g., 80° C.), the second temperature controller 528 may heat the docking connectors 526 and the DUT board 560 to the high temperature (e.g., 80° C.). When the semiconductor devices 10 are cooled to the low temperature (e.g., −25° C.), the second temperature controller 528 may cool the docking connectors 526 and the DUT board 560 to the low temperature (e.g., −25° C.). The second temperature controller 528 may include, for example, an upper box structure 527 and an upper nozzle 529. The upper box structure 527 may be disposed on the lower box structure 523. The docking connectors 526 may be provided in the upper box structure 527. The upper nozzle 529 may be disposed in the upper box structure 527. The upper nozzle 529 may be connected to the third air supply unit 550. The upper nozzle 529 may use a second hot air 551 or a second cool air 553 of the third air supply unit 550 to heat or cool the docking connectors 526 to temperatures substantially different from room temperature.

The upper plate 530 may be disposed on the upper box structure 527 of the second temperature controller 528. The upper plate 530 may include a printed circuit board disposed thereon. The docking connectors 526 may penetrate the upper plate 530 to come into connection with the DUT board 560. The upper plate 530 may be engaged with an outer sidewall of the test chamber 320.

The second air supply unit 540 may be connected to the lower nozzle 525 of the first temperature controller 524. The second air supply unit 540 may supply the lower nozzle 525 with the room temperature air 542 to maintain the connection lines 522 in the lower box structure 523 at room temperature.

The third air supply unit 550 may be connected to the upper nozzle 529 of the second temperature controller 528. The third air supply unit 550 may supply the upper nozzle 529 with the second hot air 551 or the second cool air 553 to heat or cool the docking connectors 526 in the upper box structure 527 to temperatures substantially different from room temperature. The second hot air 551 and the second cool air 553 may be temperatures substantially different from atmospheric air. For example, the second hot air 551 may be the same temperature as the first hot air 351. The second hot air 551 may have a temperature substantially greater than an atmospheric air temperature (e.g., 20° C. to 25° C.). For example, the second hot air 551 may have a temperature of about 80° C. or more. The second cool air 553 may have a temperature less than an atmospheric air temperature (e.g., 20° C. to 25° C.). The second cool air 553 may be the same temperature as the first cool air 353. The second cool air 553 may have a temperature of about −25° C. or less. The third air supply unit 550 may include, for example, a second hot air supply 552 and a second cool air supply 554. The second hot air supply 552 may provide the upper nozzle 529 with the second hot air 551 to heat the docking connectors 526. The second cool air supply 554 may provide the upper nozzle 529 with the second cool air 553 to cool the docking connectors 526.

The DUT board 560 may be disposed between the upper plate 530 and the contact drive plate 410. For example, the DUT board 560 may include a printed circuit board. The DUT board 560 may be disposed in the test chamber 320. The DUT board 560 may be electrically connected to the docking connectors 526. When the pusher module 400 pushes the semiconductor devices 10 against the DUT board 560, the DUT board 560 may connect the semiconductor devices 10 to the tester 510.

The test tray 206 may be disposed on the DUT board 560 at a first surface adjacent to the test module 500. The contact drive plate 410 may be disposed on the test tray 206. The contact drive plate 410 may push the test tray 206 against the DUT board 560. The rod pusher 420 may be connected to a pusher plate 422 and pusher pins 424. The pusher plate 422 may be disposed on the contact drive plate 410. The pusher pins 424 may be connected to a bottom surface of the pusher plate 422. The pusher pins 424 may be aligned with the semiconductor devices 10. The pusher pins 424 may penetrate the contact drive plate 410 and may push the semiconductor devices 10 against the DUT board 560. The semiconductor devices 10 may be electrically connected through the DUT board 560 to the tester 510.

Figure 9:
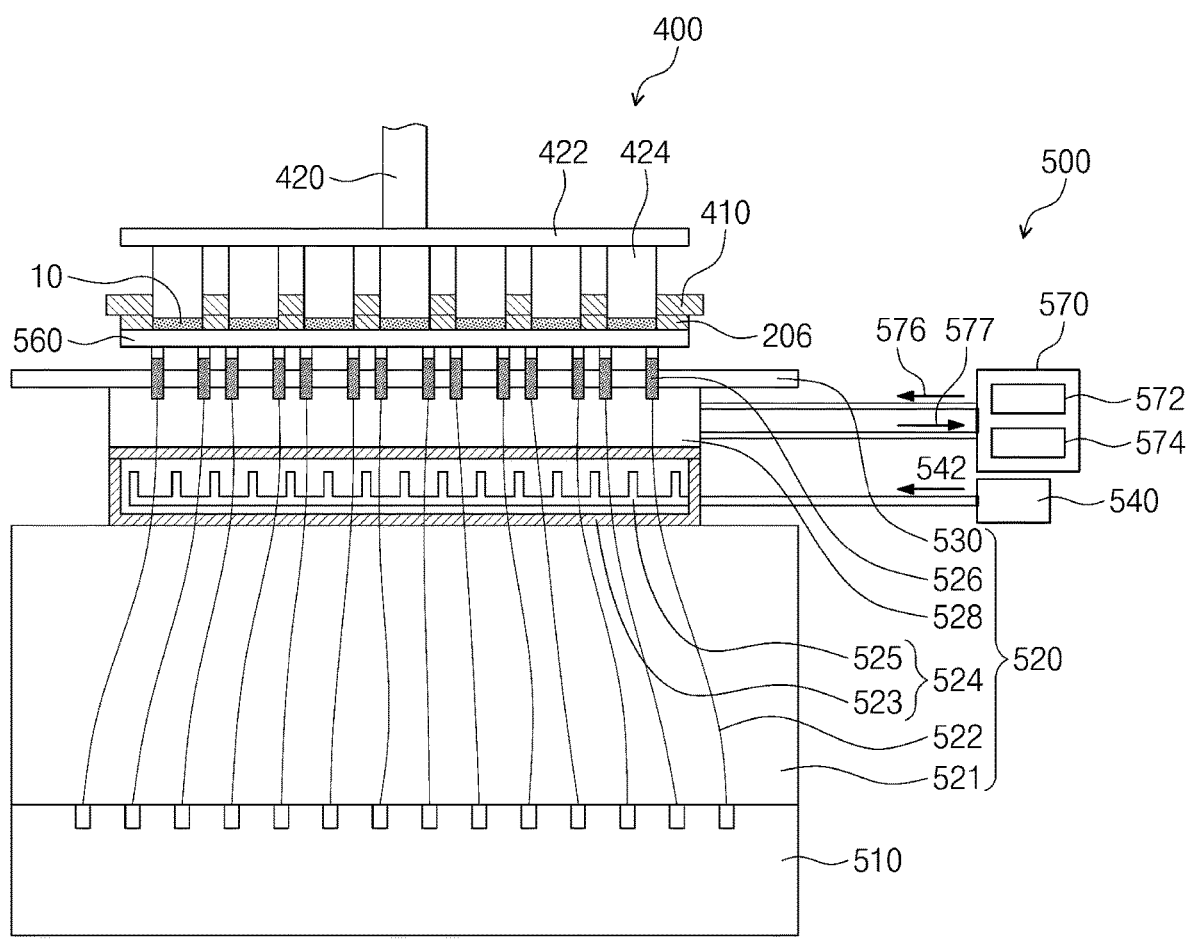
FIG. 9 is a cross-sectional view illustrating the test module depicted in FIG. 7, according to an exemplary embodiment of the present inventive concept.

FIG. 9 shows the test module 500 depicted in FIG. 7, according to an exemplary embodiment of the present inventive concept.

Referring to FIG. 9, the test module 500 may include a second heat exchanger 570. The second heat exchanger 570 may be connected to the second temperature controller 528. The second heat exchanger 570 may supply the second temperature controller 528 with a second coolant 577 or a second heat medium 576 to cool or heat the docking connectors 526. For example, the second heat exchanger 570 may include a second heater 572 and a second chiller 574. The second heater 572 may circularly supply the second temperature controller 528 with the second heat medium 576. The second chiller 574 may circularly supply the second coolant 577.

The tester 510, the lower plate 521 of the base board 520, the connection lines 522, the first temperature controller 524, the docking connectors 526, the upper plate 530, the second air supply unit 540, the DUT board 560, and the pusher module 400 may be configured similarly to those in FIG. 8.

Figure 10:
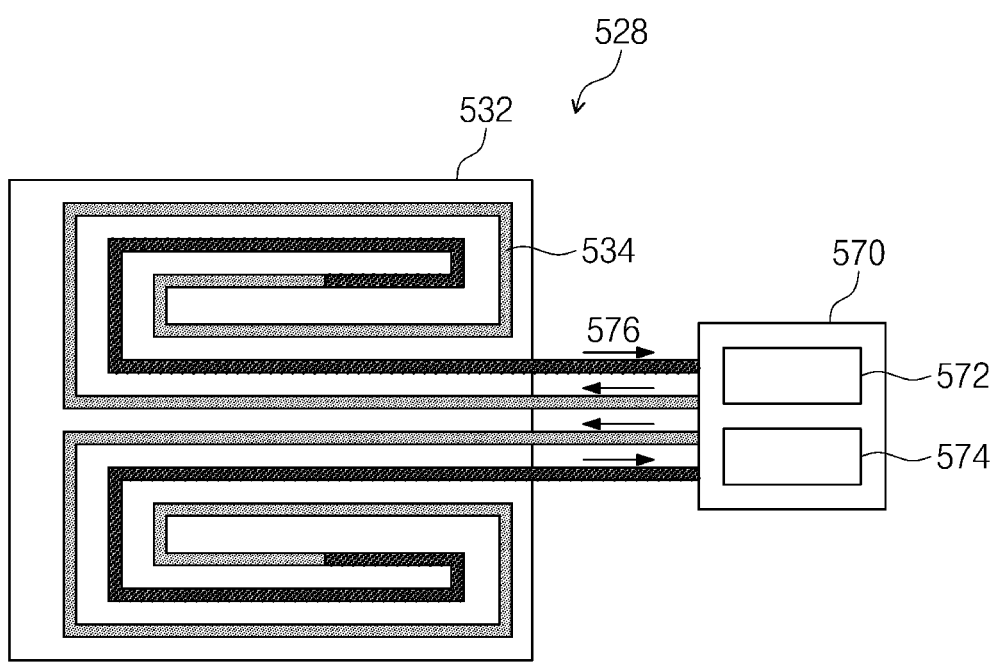
FIG. 10 is a plan view illustrating the second temperature controller depicted in FIG. 9, according to an exemplary embodiment of the present inventive concept.

FIG. 10 shows the second temperature controller 528 depicted in FIG. 9, according to an exemplary embodiment of the present inventive concept.

Referring to FIG. 10, the second temperature controller 528 may include a heat radiation plate 532 having a second fluid path 534. The heat radiation plate 532 may have a rectangular shape. The heat radiation plate 532 may include a metal plate made of, for example, an aluminum alloy. The second fluid path 534 may be comprised of coils disposed within the heat radiation plate 532. For example, the second fluid path 534 may be spirally arranged on opposite sides in the heat radiation plate 532.

FIG. 11 shows differences in temperature of the semiconductor devices 10 tested in a typical test module, according to an exemplary embodiment of the present inventive concept.

Referring to FIG. 11, when a typical test module tests the semiconductor devices 10 at a target temperature (e.g., −25° C.), the semiconductor devices 10 may have temperature that deviate from the target temperature. For example, the temperatures of the semiconductor devices 10 may be greater than the target temperature (e.g., −25° C.) based on their position on the test tray 206. For example, the semiconductor devices 10 may have temperatures that are about 1° C. to about 5° C. higher than the target temperature (e.g., 25° C.) from center to corner of the test tray 206. The semiconductor devices 10 on the center of the test tray 206 may have their temperatures (e.g., −20° C.) that are about 5° C. higher than the target temperature (e.g., −25° C.), and the semiconductor devices 10 on the corner of the test tray 206 may have their temperatures (e.g., −24° C.) that are about VC higher than the target temperature (e.g., −25° C.). Accordingly, the typical test module may decrease in reliability of the test process.

Referring back to FIGS. 8 and 9, the second temperature controller 528 may use the second cool air 553 or the second coolant 577 to cool the docking connectors 526 and the DUT board 560 to the target temperature (e.g., 25° C.), and thus the temperature differences of the semiconductor devices 10 may be removed to increase reliability of the test process.

Figure 12:
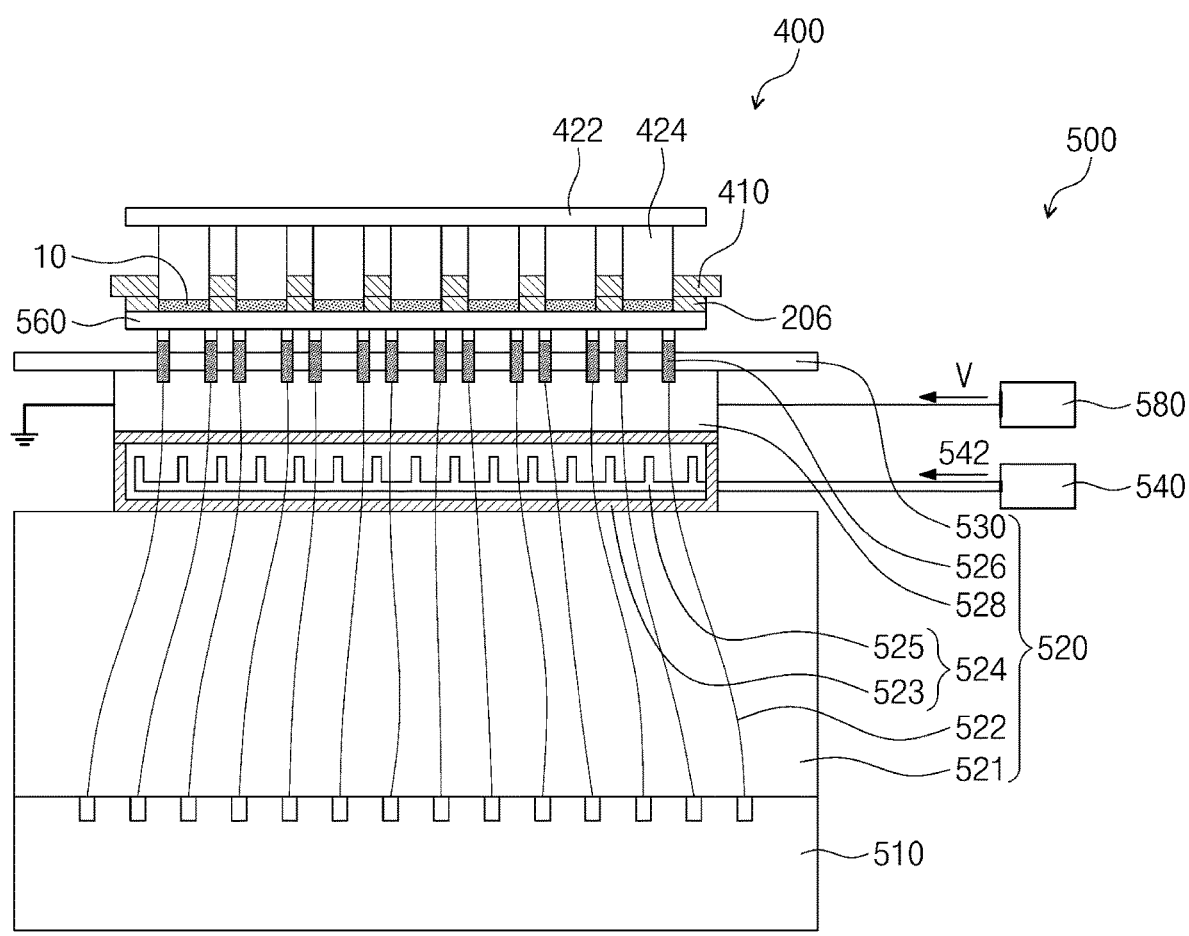
FIG. 12 is a cross-sectional view illustrating the test module depicted in FIG. 7, according to an exemplary embodiment of the present inventive concept.

FIG. 12 shows an example of the test module 500 depicted in FIG. 7, according to an exemplary embodiment of the present inventive concept.

Referring to FIG. 12, the test module 500 may include a power supply unit 580. The power supply unit 580 may provide the second temperature controller 528 with power V. For example, the power supply unit 580 may provide a direct-current power to the second temperature controller 528. The second temperature controller 528 may be electrically grounded. The pusher module 400, the tester 510 of the test module 500, the base board 520, and the second air supply unit 540 may be configured similarly to those in FIG. 8 or 9.

Figure 13:
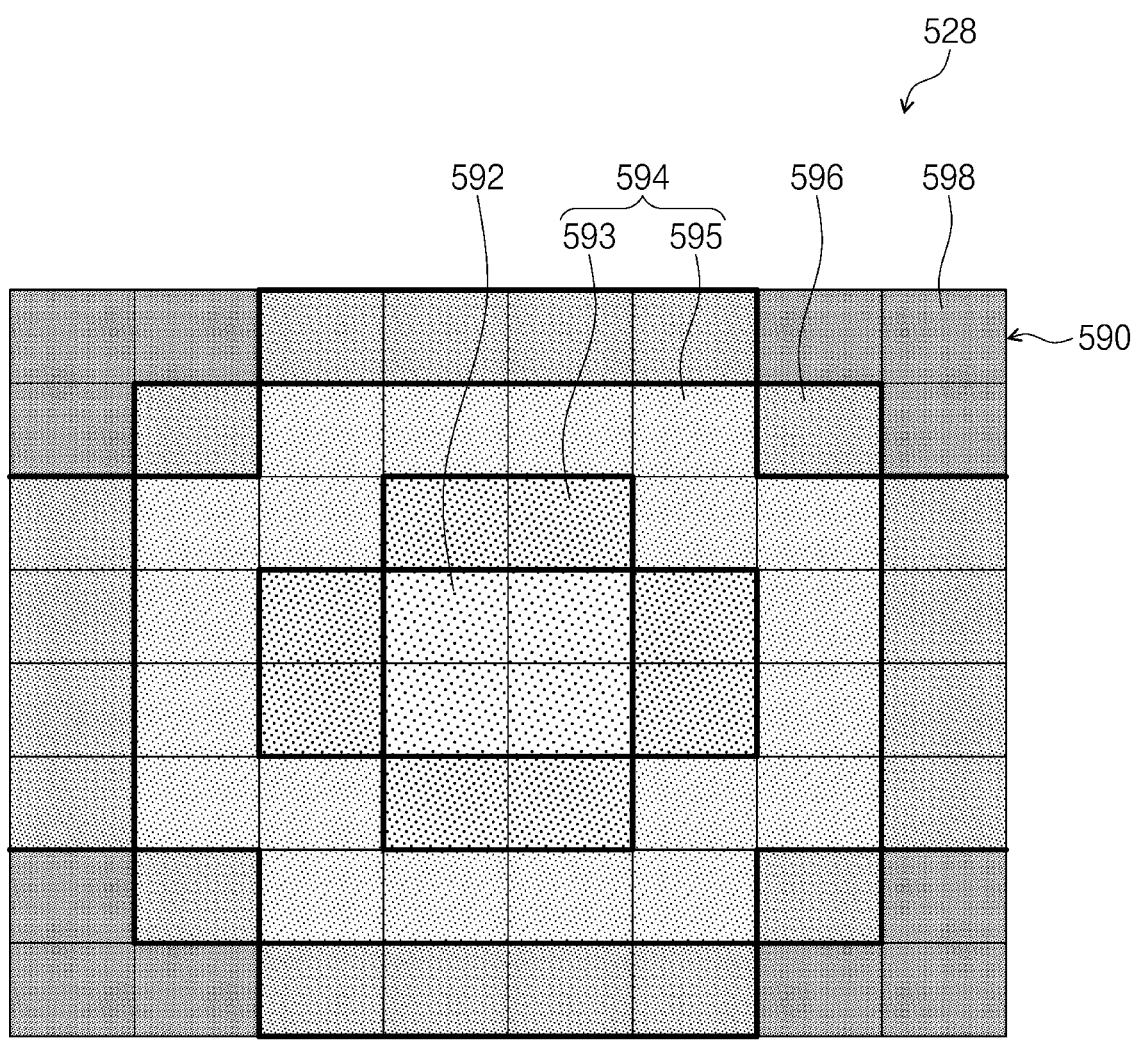
FIG. 13 is a plan view illustrating the second temperature controller depicted in FIG. 12, according to an exemplary embodiment of the present inventive concept.

FIG. 13 shows an example of the second temperature controller 528 depicted in FIG. 12, according to an exemplary embodiment of the present inventive concept.

Referring to FIG. 13, the second temperature controller 528 may include thermocouple blocks 590. The thermocouple blocks 590 may use the power V to cool or heat the docking connectors 526, the DUT board 560, and the semiconductor devices 10. The power V may be provided to each of the thermocouple blocks 590. For example, the power V may be non-uniformly applied to individual thermocouple blocks 590.

The tester 510, the lower plate 521 of the base board 520, the connection lines 522, the first temperature controller 524, the docking connectors 526, the upper plate 530, the second air supply unit 540, the DUT board 560, and the pusher module 400 may be configured similarly to those in FIG. 8.

When, due to the first cool air 353, the semiconductor devices 10 in the test chamber 320 are cooled with a difference in temperature, the thermocouple blocks 590 may gradually cool the docking connectors 526 and the DUT board 560 such that the semiconductor devices 10 may be cooled to a uniform temperature. Alternatively, the thermocouple blocks 590 may gradually heat the docking connectors 526 and the DUT board 560 such that the semiconductor devices 10 may be heated to a uniform temperature. The thermocouple blocks 590 may be distributed on a central region 592, a middle region 594, an edge region 596, and a corner region 598 of the second temperature controller 528. For example, the middle region 594 may at least partially surround the central region 592, and the edge region 596 may be disposed at corners of the middle region 594 and between adjacent corner regions 598.

The central region 592 may be disposed between the middle region 594 and the edge region 596. The thermocouple blocks 590 in the central region 592 may be arranged in a rectangular shape (e.g., a 2×2 array). When the semiconductor devices 10 are cooled, the central region 592 may have a temperature (e.g., −30° C.) lower than temperatures (e.g., −26° C. to −29° C.) of the middle, edge, and corner regions 594, 596, and 598. The semiconductor devices 10 on the central region 592 may be cooled to the low temperature, or the target temperature (e.g., −25° C.), without a difference in temperature from the remainder of the semiconductor devices 10.

According to an exemplary embodiment of the present inventive concept, the thermocouple blocks 590 may be arranged in a variety of shapes. For example, the thermocouple blocks 590 may be formed in various concentric shapes, such as circles. Furthermore, the thermocouple blocks 590 in different regions may be comprised of materials with different specific heats, and/or the thermocouple blocks 590 may individually be configured to adjust to temperature differences in the semiconductor devices 10 detected in real time. The middle region 594 may be disposed between the central region 592 and the edge region 596. For example, the middle region 594 may include a first middle region 593 and a second middle region 595. The first middle region 593 may be disposed between the central region 592 and the second middle region 595. The thermocouple blocks 590 in the first middle region 593 may be arranged in a polygonal ring shape. The second middle region 595 may be disposed between the first middle region 593 and the edge region 596. The thermocouple blocks 590 in the second middle region 595 may be arranged in a polygonal ring shape. When the semiconductor devices 10 are cooled, the first middle region 593 may be cooled to a temperature (e.g., −29° C.) higher than a temperature (e.g., −30° C.) of the central region 592 and lower than temperatures (e.g., −26° C. to −27° C.) of the edge and corner regions 596 and 598. The second middle region 595 may be cooled to a temperature (e.g., −28° C.) higher than a temperature (e.g., −29° C.) of the first middle region 593 and lower than temperatures (e.g., −26° C. to −27° C.) of the edge and corner regions 596 and 598. The semiconductor devices 10 on the first and second middle regions 593 and 595 may be cooled to a low temperature, or the target temperature (e.g., −25° C.), without a difference in temperature from the remainder of the semiconductor devices 10.

The edge region 596 may at least partially surround the second middle region 595. The thermocouple blocks 590 on the edge region 596 may be arranged in a polygonal ring shape. When the semiconductor devices 10 are cooled, the edge region 596 may have a temperature (e.g., −27° C.) higher than temperatures (e.g., −28° C. to −30° C.) of the central and middle regions 592 and 594 and lower than a temperature (e.g., −29° C.) of the corner region 598. The semiconductor devices 10 on the edge region 596 may be cooled to low temperature, or the target temperature (e.g., −25° C.), without a difference in temperature from the remainder of the semiconductor devices 10.

A plurality of corner regions 598 may be disposed around the edge region 596. The corner regions 598 may be disposed on four corners of the second temperature controller 528. The thermocouple blocks 590 on each of the corner regions 598 may be arranged in a hexagonal shape. When the semiconductor devices 10 are cooled, the corners regions 598 may have a temperature (e.g., −26° C.) higher than temperatures (e.g., −27° C. to −30° C.) of the central, middle, and edge regions 592, 594, and 596 and lower than the target temperature (e.g., −25° C.). The semiconductor devices 10 on the corner regions 598 may be cooled to low temperature, or the target temperature (e.g., −25° C.), without a difference in temperature from the remainder of the semiconductor devices 10.

Hereafter, a method of testing the semiconductor devices 10 by using the test handler 1000, as described above, will be discussed.

Figure 14:
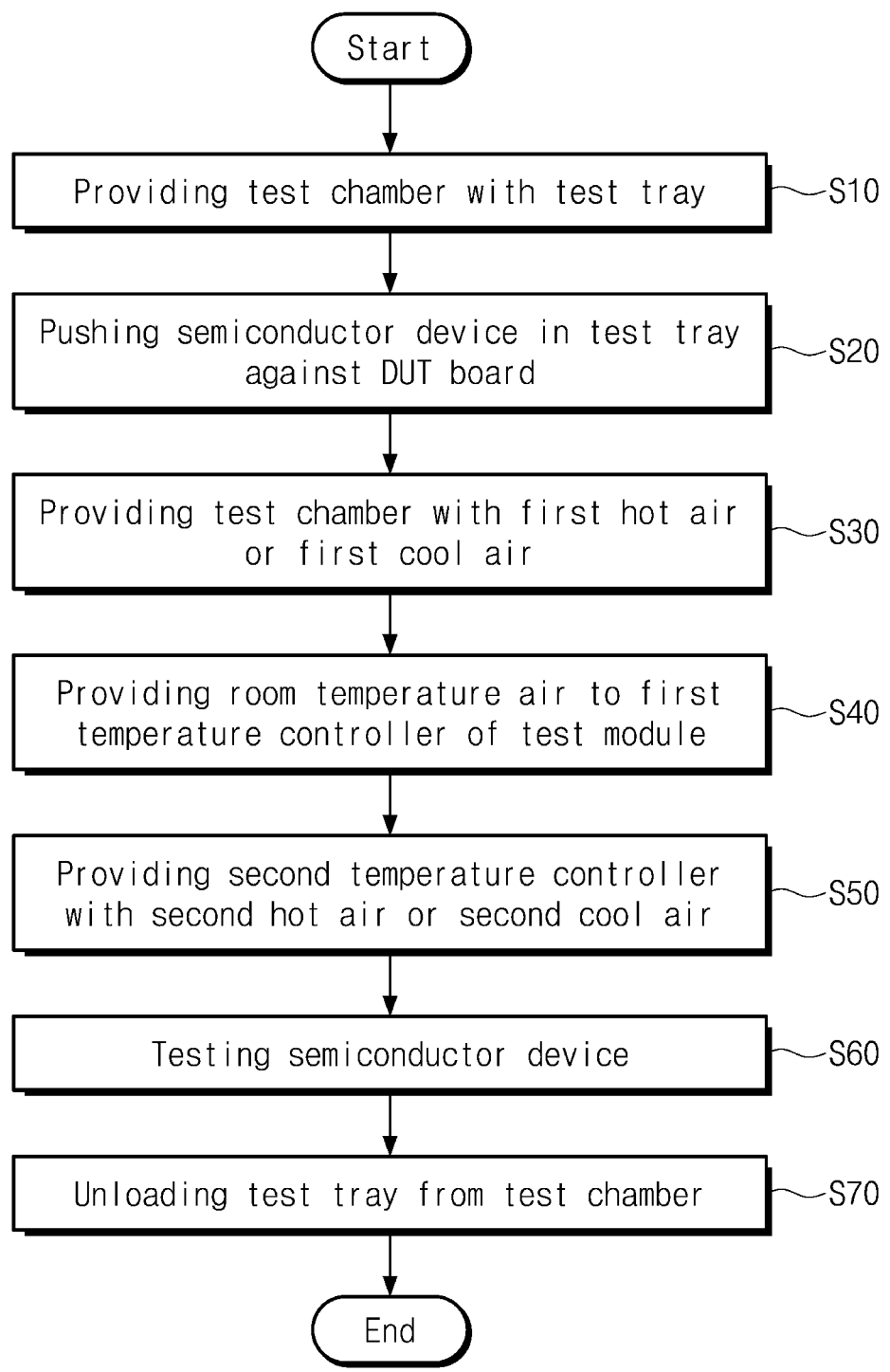
FIG. 14 is a flow chart illustrating a method of testing a semiconductor device, according to an exemplary embodiment of the present inventive concept.

FIG. 14 is a flowchart illustrating a method of testing the semiconductor devices 10.

Referring to FIG. 14, the first robot arm in the soak chamber 310 may provide the test tray 206 into the test chamber 320 (S10). The test tray 206 may be pre-heated or pre-cooled in the soak chamber 310.

The pusher module 400 may push the semiconductor devices 10 in the test tray 206 against the DUT board 560 (S20). The semiconductor devices 10 may be electrically connected through the DUT board 560 to the tester 510.

The first air supply unit 350 may supply the test chamber 320 with the first hot air 351 or the first cool air 353 to heat or cool the semiconductor devices 10 (S30). The first hot air supply 352 may provide the first hot air 351 into the test chamber 320. The first hot air 351 may have a temperature of about 80° C. or more. The semiconductor devices 10 may be heated to a temperature of about 80° C. or more. Alternatively, the first cool air supply 354 may provide the first cool air 353 into the test chamber 320. The first cool air 353 may have a temperature of about −25° C. or less. The semiconductor devices 10 may be cooled to a temperature of about 25° C. or less.

The second air supply unit 540 may supply the room temperature air 542 into the first temperature controller 524 (S40). The first temperature controller 524 may provide the connection lines 522 of the test module 500 with the room temperature air 542 to maintain the connection lines 522 at room temperature (e.g., 20° C. to 25°). The lower nozzle 525 of the first temperature controller 524 may introduce the room temperature air 542 to the connection lines 522, and the lower box structure 523 may temporarily store the room temperature air 542. For example, the lower box structure 523 may have an outlet port that emits the air previously introduced at room temperature.

The third air supply unit 550 may supply the second temperature controller 528 with the second hot air 551 or the second cool air 553 to heat or cool the docking connectors 526 (S50). The second hot air 551 may have the same temperature as that of the first hot air 351. For example, the second hot air 551 may have a temperature of about 80° C. or more. When the second temperature controller 528 is provided with the second hot air 551, the docking connectors 526 and the DUT board 560 may be heated to a temperature of about 80° C. or more. The second cool air 553 may have the same temperature as that of the first cool air 353. For example, the second cool air 553 may have a temperature of about −25° C. or less. When the second temperature controller 528 is provided with the second cool air 553, the docking connectors 526 and the DUT board 560 may be cooled to a temperature of about −25° C. or less. The semiconductor devices 10 may thus be cooled to the target temperature (e.g., −25° C.) without a difference in temperature from one another.

The tester 510 may test the semiconductor devices 10 in the test tray 206 (S60). The semiconductor devices 10 may be tested at high temperature (e.g., 80° C.) or low temperature (e.g., −25° C.) without a difference in temperature form one another. The semiconductor devices 10 may be tested for about 10 minutes to about 1 hour. The connection lines 522 at room temperature may be used by the tester 510 to obtain a test result of each of the semiconductor devices 10.

When completing the test on the semiconductor devices 10 in the test tray 206, the second robot arm in the exit chamber 330 may transfer the test tray 206 from the test chamber 320 to the unloader 230 (S70). The unloader 230 may sort the semiconductor devices 10 based on the test results and then may transfer the semiconductor devices 10 to the carrier tray 204.

According to an exemplary embodiment of the present inventive concept, a test module may use a temperature controller to cool or heat docking connectors and a DUT board to remove or reduce a difference in temperature of semiconductor devices in a test tray on the DUT board.

Although exemplary embodiments of the present inventive concept have been shown and described heretofore, it will be understood by those skilled in the art that various changes in form and details may be made herein without departing from the spirit and scope of the present inventive concept.

What is claimed is:

1. A test module, comprising:
   a tester that electrically tests a semiconductor device;
   a device under test (DUT) board connected to the tester and the semiconductor device; and
   a base board disposed between the DUT board and the tester,
   wherein the base board includes:
      a lower plate;
      a plurality of connection lines that penetrate the lower plate;
      an upper plate disposed over the lower plate;
      a first temperature controller disposed over the lower plate, the first temperature controller maintaining the connection lines at a first temperature;
      a docking connector disposed over the first temperature controller, the docking connector connecting the connection lines to the DUT board; and
      a second temperature controller disposed between the first temperature controller and the upper plate, the second temperature controller maintaining the docking connector at a second temperature different from the first temperature.

2. The test module of claim 1, wherein the first temperature controller includes:
   a lower box structure; and
   a lower nozzle in the lower box structure.

3. The test module of claim 2, further comprising: a first air supply unit that provides the lower nozzle with air.

4. The test module of claim 2, wherein the second temperature controller includes:
an upper box structure on the lower box structure; and
an upper nozzle in the upper box structure.

5. The test module of claim 4, further comprising:
a second air supply unit that provides the upper nozzle with a cool air or a hot air.

6. The test module of claim 1, wherein the second temperature controller includes a heat radiation plate that has a fluid path.

7. The test module of claim 6, further comprising:
a heat exchanger that circularly supplies the fluid path with a coolant or a heat medium.

8. The test module of claim 1, wherein the second temperature controller includes a plurality of thermocouple blocks.

9. The test module of claim 8, wherein the second temperature controller is divided into a central region, an edge region that at least partially surrounds the central region, a middle region disposed between the edge region and the central region, and a corner region arranged adjacent to the edge region, wherein the thermocouple blocks are distributed in the central region, the edge region, the middle region, and the corner region.

10. The test module of claim 8, further comprising:
a power supply unit that supplies the thermocouple blocks with power.

11. A test handler, comprising:
a sorting apparatus transferring a tray on which a semiconductor device is mounted; and
a test apparatus adjacent to the sorting apparatus, the test apparatus including a test chamber which receives the tray, and a test module electrically connected to the semiconductor device on the tray in the test chamber,
wherein the test module includes:
a tester that electrically tests the semiconductor device;
a device under test (DUT) board connected to the semiconductor device; and
a base board connected to the DUT board and the tester,
wherein the base board includes:
a lower plate;
a plurality of connection lines that penetrate the lower plate;
an upper plate disposed over the lower plate;
a docking connector that penetrates the upper plate and connects the plurality of connection lines to the DUT board;
a first temperature controller disposed between the lower plate and the docking connector, the first temperature controller maintaining the connection lines at a first temperature; and
a second temperature controller, the second temperature controller maintaining the docking connector at a second temperature different from the first temperature.

12. The test handler of claim 11, wherein the test apparatus further comprises a first air supply unit that supplies the test handler with a first hot air or a first cool air, the first hot air and the first cool air being different from room temperature air,
wherein the test module further includes a second air supply unit that supplies the second temperature controller with either a second hot air the same as the first hot air or a second cool air the same as the first cool air.

13. The test handler of claim 12, wherein the first air supply unit includes:
a first hot air supply that supplies the first hot air; and
a first cool air supply that supplies the first cool air.

14. The test handler of claim 12, wherein the second air supply unit includes:
a second hot air supply that supplies the second hot air; and
a second cool air supply that supplies the second cool air.

15. The test handler of claim 11, wherein the test apparatus further includes a pusher module that pushes the semiconductor device in the tray against the DUT board.

16. A method of testing a semiconductor device, the method comprising:
providing a test chamber with a device under test (DUT) board on which a test tray is disposed, wherein the semiconductor device is mounted on the test tray;
providing the test chamber with a first hot air or a first cool air to heat or cool the semiconductor device to a first temperature, wherein the first hot air and the first cool air are different from room temperature air;
providing a first temperature controller with the room temperature air to maintain a plurality of connection lines at a second temperature different from the first temperature, wherein the first temperature controller is disposed below the DUT board, and wherein the connection lines are connected to the DUT board;
providing a second temperature controller disposed between the DUT board and the first temperature controller with a second hot air or a second cool air to heat or cool a docking connector to the first temperature, wherein the second hot air and the second cool air are different from room temperature air, and wherein the docking connector connects the connection lines to the DUT board; and
testing the semiconductor device by using a tester connected to the connection lines.

17. The method of claim 16, wherein the second hot air has a temperature the same as a temperature of the first hot air.

18. The method of claim 16, wherein the second cool air has a temperature the same as a temperature of the first cool air.

19. The method of claim 16, further comprising: pushing the semiconductor device in the tray against the DUT board.

20. The method of claim 16, wherein the first temperature is in a range between −25° C. and 80° C., and the second temperature is in a range between 20° C. and 25° C.

* * * * *